United States Patent
Pirchio et al.

(10) Patent No.: US 8,937,797 B2
(45) Date of Patent: Jan. 20, 2015

(54) METHOD AND APPARATUS TO DETECT A BROKEN WIRE CONDITION IN AN INTEGRATED CIRCUIT

(75) Inventors: Franco Noel Martin Pirchio, Ciudad de Buenos Aires (AR); Cory Voisine, Weare, NH (US); Hernan D. Romero, Pcia. Buenos Aires (AR); Gerardo Monreal, Pilar (AR)

(73) Assignee: Allegro Microsystems, LLC, Worcester, MA (US)

(*) Notice: Subject to any disclaimer, the term of this patent is extended or adjusted under 35 U.S.C. 154(b) by 396 days.

(21) Appl. No.: 13/423,891

(22) Filed: Mar. 19, 2012

(65) Prior Publication Data

US 2013/0242447 A1 Sep. 19, 2013

(51) Int. Cl.
*H02H 3/00* (2006.01)
*H02H 7/00* (2006.01)
*H02H 9/02* (2006.01)
*H02H 3/20* (2006.01)
*H02H 3/24* (2006.01)
*H03F 3/18* (2006.01)

(52) U.S. Cl.
USPC .............................. 361/101; 361/90; 330/264

(58) Field of Classification Search
CPC .............................. G01R 31/08; G01R 31/026
USPC ........................................................ 361/101
See application file for complete search history.

(56) References Cited

U.S. PATENT DOCUMENTS

| | | | |
|---|---|---|---|
| 4,599,576 A * | 7/1986 | Yoshida et al. | 330/264 |
| 5,880,620 A * | 3/1999 | Gitlin et al. | 327/534 |
| 6,396,315 B1 | 5/2002 | Morris | |
| 6,520,615 B1 | 2/2003 | Beck et al. | |
| 6,630,844 B1 | 10/2003 | Chong et al. | |
| 7,054,123 B2 * | 5/2006 | Ausserlechner et al. | 361/90 |
| 2006/0284655 A1 | 12/2006 | Li et al. | |
| 2009/0033383 A1 * | 2/2009 | Wyatt et al. | 327/157 |

OTHER PUBLICATIONS

Melexis, Microelectronic Integrated Systems; ""Under-the-Hood" Triaxis Rotary Position;" MLX90324; Dec. 2008; pp. 1-40.
PCT Search Report of the ISA for PCT/US2013/027886 dated Jun. 13, 2013.
Written Opinion of the ISA for PCT/US2013/027886 dated Jun. 13, 2013.

* cited by examiner

*Primary Examiner* — Jared Fureman
*Assistant Examiner* — Lucy Thomas
(74) *Attorney, Agent, or Firm* — Daly, Crowley, Mofford & Durkee, LLP

(57) ABSTRACT

An integrated circuit includes circuitry to sense the occurrence of a break in a ground connection and/or supply connection and to indicate same to an exterior environment. In at least one implementation, the break may be indicated by providing a signal on an output terminal of the device that is not associated with a normal output of the device.

15 Claims, 5 Drawing Sheets

METHOD AND APPARATUS TO DETECT A BROKEN WIRE CONDITION IN AN INTEGRATED CIRCUIT

FIELD

Subject matter disclosed herein relates generally to integrated circuits and, more particularly, to techniques for detecting fault conditions in integrated circuits and indicating those fault conditions to an exterior environment.

BACKGROUND

Integrated circuits generally include contacts or terminals that may need to be connected to external circuits to enable proper functioning of the devices. For example, an integrated circuit may include a supply terminal for connection to an external power supply and a ground terminal for connection to an external ground.

During operation of an integrated circuit, a break may occur in a connection between one or more terminals of the device and a corresponding external circuit. Such breaks can occur for any number of reasons. For example, a trace on a circuit board carrying the integrated circuit may fail, a pin may free itself from a socket, a wire may become detached or physically broken, and/or other reasons.

It is desirable that such breaks be detected so that appropriate steps may be taken to restore the broken connection. It is also desirable that techniques be provided for communicating a detected break to external diagnostic or control circuitry.

SUMMARY

In accordance with the concepts, systems, circuits, and techniques described herein, an integrated circuit includes a supply terminal to connect to an external power supply, a ground terminal to connect to an external ground, an output terminal to connect to an external load, an output amplifier coupled to the output terminal to generate an output signal on the output terminal during normal device operation, and circuitry to prevent current from flowing through the output terminal if at least one of the following occurs during device operation: a connection between the ground terminal and the external ground is broken and a connection between the supply terminal and the external power supply is broken.

In one embodiment, the circuitry to prevent current from flowing through the output terminal includes a switch coupled between the supply terminal and the ground terminal.

In one embodiment, the external load is an external pull-down load; the output amplifier includes an output stage having a p-channel transistor and an n-channel transistor; and the switch includes a first switch coupled between the n-channel transistor and the ground terminal. In one embodiment, the p-channel transistor includes a p-channel insulated gate field effect transistor (IGFET) and the n-channel transistor includes an n-channel IGFET.

In one embodiment, the circuitry further includes a control circuit to detect a break in a connection between the ground terminal and the external ground and to turn off the first switch in response thereto. In one embodiment, the control circuit comprises a second switch connected between the output terminal of the integrated circuit and an input terminal of the first switch, the second switch to turn on if a break occurs in a connection between the ground terminal and the external ground. In one embodiment, the control circuit further comprises a body bias circuit to modify a body bias condition of the second switch if a break occurs in a connection between the ground terminal and the external ground.

In one embodiment, the second switch includes a first n-channel insulated gate field effect transistor (IGFET) and a second n-channel IGFET connected in tandem between the output terminal of the integrated circuit and the input terminal of the first switch, wherein a body of the first n-channel IGFET and a body of the second n-channel IGFET are both connected to a node between the first n-channel IGFET and the second n-channel IGFET; and the body bias circuit connects the node to the input terminal of the first switch if a break occurs in a connection between the ground terminal and the external ground and de-couples the node from the input terminal of the first switch during normal device operation. In one embodiment, the body bias circuit couples the node to the ground terminal during normal device operation.

In one embodiment, the control circuit comprises a third switch connected between the supply terminal and an input terminal of the first switch, the third switch to connect the input terminal of the first switch to a supply potential during normal operation and to disconnect the input terminal of the first switch from the supply potential if a break occurs in a connection between the ground terminal and the external ground.

In one embodiment, the first switch, when turned off, prevents a flow of current to the external load through the n-channel transistor of the output amplifier.

In one embodiment, the external load is an external pull-up load, the output amplifier includes an output stage having a p-channel transistor and an n-channel transistor, and the switch includes a first switch coupled between the p-channel transistor of the output stage and the supply terminal. In one embodiment, the circuitry further includes a control circuit to detect a break in a connection between the supply terminal and the external power supply and to turn off the first switch in response thereto.

In accordance with a further aspect of the concepts, systems, circuits and techniques described herein, a method for operating an integrated circuit having an output amplifier to drive an external load through an output terminal includes monitoring operation of the integrated circuit to detect whether one or more of the following events have occurred: a connection between a ground terminal of the integrated circuit and an external ground is broken and a connection between a supply terminal of the integrated circuit and an external power supply is broken; and changing an operational condition of the output amplifier if one or more of the events have occurred, wherein changing the operational condition of the output amplifier includes switching a switch to prevent current flow through a parasitic element of the output amplifier.

In one embodiment, the external load is a pull-down load, the output amplifier includes an output stage having a p-channel transistor and an n-channel transistor, and changing an operational condition includes providing a large impedance between the n-channel transistor and the ground terminal if a break is detected in a connection between the ground terminal and the external ground. In one embodiment, providing a large impedance between the n-channel transistor and the ground terminal includes turning off a first switch located between the re-channel transistor and the ground terminal.

In one embodiment, the first switch includes an input terminal; and turning off the first switch includes connecting the input terminal of the first switch to the output terminal of the integrated circuit. In one embodiment, turning off the first switch further includes disconnecting the input terminal from the supply terminal of the integrated circuit.

In one embodiment, connecting the input terminal of the first switch to the output terminal of the integrated circuit includes turning on a second switch, the second switch including two n-channel transistors connected in series, the two n-channel transistors having a node interconnecting them that is connected to bodies of the two n-channel transistors.

In one embodiment, turning off the first switch further includes de-coupling the node between the two n-channel transistors of the second switch from the ground terminal. In one embodiment, turning off the first switch further includes coupling the node between the two n-channel transistors of the second switch to the input terminal of the first switch.

In one embodiment, the external load is a pull up load, the output amplifier includes an output stage having a p-channel transistor and an n-channel transistor; and changing an operational condition includes providing a large impedance between the p-channel transistor and the supply terminal if a break is detected in a connection between the supply terminal and the external power supply. In one embodiment, providing a large impedance between the p-channel transistor and the supply terminal includes turning off a first switch between the p-channel transistor and the supply terminal.

BRIEF DESCRIPTION OF THE DRAWINGS

The foregoing features of this invention, as well as the invention itself, may be more fully understood from the following description of the drawings in which.

DETAILED DESCRIPTION

Figure 1:
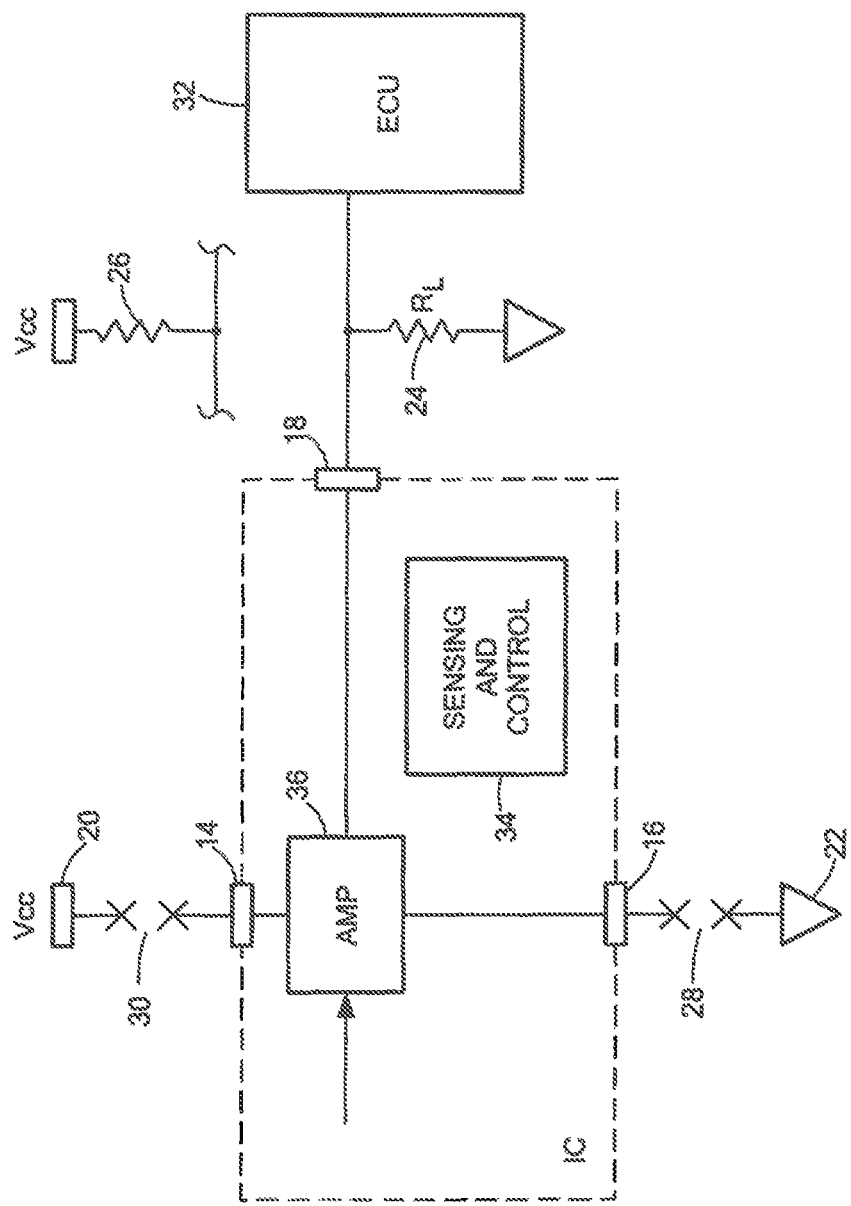
FIG. 1 is a block diagram illustrating an example operating environment for an integrated circuit in accordance with one or more implementations.

FIG. 1 is a block diagram illustrating an example operating environment 10 for an integrated circuit 12 in accordance with one or more implementations. As illustrated, integrated circuit 12 may include a supply terminal 14 for connection to an external power supply 20, a ground terminal 16 for connection to an external ground 22, and an output terminal 18 for connection to an external load ($R_L$) 24. Integrated circuit 12 may include circuitry (not shown) for performing a particular function for an end user. As part of this function, integrated circuit 12 may generate an output signal on output terminal 18 that can be used by other circuitry within, for example, a larger system. An output amplifier 36 may be provided within integrated circuit 12 to drive the output terminal 18 and external load 24 during device operation.

To operate integrated circuit 12, supply terminal 14 may be connected to external power supply 20, ground terminal 16 may be connected to external ground 22, and output terminal 18 may be connected to external load ($R_L$) 24. Although shown as a resistor, it should be understood that external load 24 is merely representative of a circuit or system being driven by integrated circuit 12 and may, in some instances, have a complex impedance. External load 24 illustrated in FIG. 1 represents the more common "pull-down" load that can pull an output node down to ground potential. In other implementations, an alternative "pull-up" load 26 may be used that can pull an output node up to a supply potential. Typically, an end user will determine a type of load that they want to use and purchase, design, or have designed an integrated circuit 12 that can drive such a load.

During operation of integrated circuit 12, one or more faults may occur that may interrupt the functioning of the device 12 and/or other related circuits. For example, with reference to FIG. 1, a break 28 may occur in a connection between ground terminal 16 of integrated circuit 12 and ground 22. Similarly, a break 30 may occur in a connection between supply terminal 14 of integrated circuit 12 and power supply 20. When such breaks occur, it may be beneficial to send an indication of the break to other circuitry (e.g., diagnostic circuitry, control circuitry, etc.) to warn of the condition. For example, with reference to FIG. 1, if integrated circuit 12 is being used in an automobile application, it may be beneficial to indicate faults to an engine control unit (ECU) 32 or similar diagnostic entity.

In some implementations, sensing and control circuitry 34 may be provided within integrated circuit 12 to detect one or more types of faults when they occur and effectively communicate the existence of the faults to an exterior environment. Sensing and control circuitry 34 may be adapted to detect, for example, a broken ground connection, a broken supply connection, or both. In addition, in some implementations, sensing and control circuitry 34 may cause a predetermined signal level to be provided on output terminal 18 when a fault is detected. The predetermined signal level may include a signal level that is different from output signal levels that are generated during normal operation of integrated circuit 12. As used herein, the phrases "normal operation," "normal device operation," "normal operation of integrated circuit," and similar phrases mean operation in accordance with an intended function of an integrated circuit, in the absence of faults. In the discussion that follows, it is assumed that an external pull-down load will maintain its connection to ground and an external pull-up load will maintain its connection to a power supply when a break in a ground or supply connection 28, 30, respectively, occurs for a corresponding integrated circuit.

Figure 2:
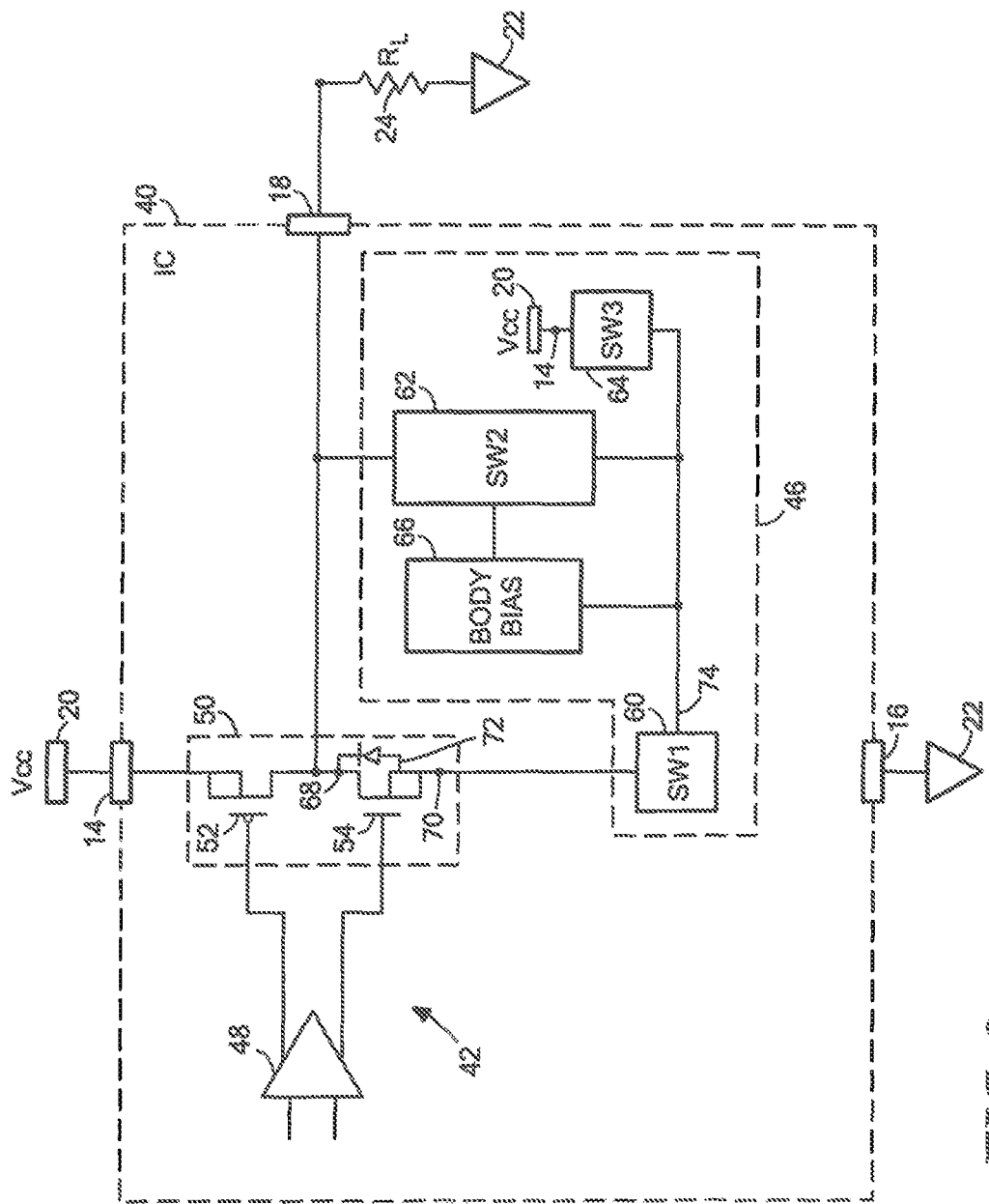
FIG. 2 is a schematic diagram illustrating an example integrated circuit that is capable of detecting a break in a ground or supply connection in accordance with one or more implementations.

FIG. 2 is a schematic diagram illustrating an example integrated circuit 40 that is capable of detecting a break in a ground or supply connection in accordance with one or more implementations. In response to detection of a break, integrated circuit 40 is capable of significantly reducing or eliminating a flow of current to or from an output terminal of the device. As shown, integrated circuit 40 has a supply terminal 14 for connection to an external power supply 20, a ground terminal 16 for connection to an external ground 22, and an output terminal 18 for connection to an external pull-down load 24. Integrated circuit 40 also includes an output amplifier 42 to drive output terminal 18 and sensing and control circuitry 46. Sensing and control circuitry 46 is operative for detecting a break in a connection between ground terminal 16 of integrated circuit 40 and ground 22 and for causing a predetermined voltage level to be present on output terminal 18 in response thereto. The predetermined voltage level may include a level that is not a valid output level during normal operation of integrated circuit 40. For example, with reference to FIG. 2, in some implementations, output stage 50 may output an analog signal on output terminal 18 during normal device operation that is within an intermediate range between a supply potential and ground potential (e.g., between 0.05×Vcc and 0.95×Vcc, etc.). In such a case, a voltage that is at or near ground potential on output terminal 18 may be used as a predetermined voltage level that is indicative of a ground fault. Diagnostic circuitry monitoring the output of integrated circuit 40 (e.g., an ECU, etc.) may be able to sense the predetermined voltage level and know that a ground fault has occurred. It should be appreciated that, in other implementations, an output amplifier may generate other forms of output signals during normal operation and different predetermined voltage levels may be used as output fault indications. Sensing and control circuitry 46 may, in some implementations, also be capable of detecting a break in a connection between supply terminal 14 and power supply 20 and of causing a different predetermined voltage level to be output on output terminal 18 in response thereto.

As illustrated in FIG. 2, in some implementations, output amplifier 42 may include an operational amplifier 48 (or similar structure) driving a output stage 50. Output stage 50 may include, for example, a p-channel transistor 52 (e.g., a p-channel insulated gate field effect transistor (IGFET), etc.) and an n-channel transistor 54 (e.g., an n-channel IGFET, etc.) connected in a specific configuration. Other types of output amplifiers may alternatively be used. Sensing and control circuitry 46 may include: a first switch 60, a second switch 62, a third switch 64, and a body bias circuit 66. First switch 60 may be connected between n-channel transistor 54 of output stage 50 and ground terminal 16. Second switch 62 and third switch 64 may both be coupled to an input terminal 74 of first switch 60 to control a state of the switch. Body bias circuit 66 may be coupled to second switch 62 to control a body bias of transistors located therein.

As will be described in greater detail, in some implementations, first switch 60 may be operative for significantly reducing or eliminating a flow of current (e.g., leakage current, etc.) through output stage 50 to external load 24 when a break occurs in a ground connection. By reducing or eliminating this flow of current during the fault condition, external load 24 will be able to pull down the voltage on output terminal 18 to ground potential. The ground potential on output terminal 18 can then be recognized by diagnostic circuitry monitoring the output terminal as an indication that a break in the ground connection has occurred.

In some implementations, integrated circuit 40 may include an internal chip impedance between supply terminal 14 and ground terminal 16. Because of this chip impedance, if a break occurs in a connection between ground terminal 16 and ground 22, a voltage on ground terminal 16 may begin to rise toward the source potential Vcc. In various implementations, as shown in FIG. 2, p-channel transistor 52 of output stage 50 may include a p-channel IGFET 52 and n-channel transistor 54 of output stage 50 may include an n-channel IGFET 54. As illustrated in FIG. 2, n-channel IGFET 54 may include a drain terminal 68 coupled to output terminal 18 of integrated circuit 40 and a source terminal 70 coupled to first switch 60. In addition, source terminal 70 of n-channel IGFET 54 may be internally electrically connected to a body of the transistor. As is well known, a parasitic diode 72 may exist between the body of n-channel IGFET 54 and drain terminal 68. If a break occurs in the connection between ground terminal 16 and ground 22, and the voltage on ground terminal 16 begins to rise toward Vcc, a current may begin to flow through parasitic diode 72 toward output terminal 18. This current may prevent external load 24 from pulling down the output terminal 18 to ground potential.

To prevent a flow of current through parasitic diode 72 of n-channel IGFET 54 during a fault condition, first switch 60 may be turned "off" when a break in the ground connection is detected. During normal device operation, first switch 60 may be maintained in an "on" condition to provide a low impedance between n-channel IGFET 54 and ground 22. To keep first switch 60 in an "on" condition during normal device operation, third switch 64 may connect input terminal 74 of first switch 60 to supply terminal 20. When a break is detected in the ground connection, however, third switch 64 may decouple input terminal 74 of first switch 60 from supply terminal 20. During normal device operation, second switch 62 may be kept "off," providing a large impedance (e.g., an open circuit, etc.) between output terminal 18 and input terminal 74 of first switch 60. When a break occurs in the ground connection, and ground terminal 16 transitions towards Vcc, second switch 62 may be switched "on," thereby providing a small impedance (e.g., a short circuit, etc.) between output terminal 18 and input terminal 74 of first switch 60. At about the same time, body bias circuit 66 may connect the bodies of transistors within second switch 62 to input terminal 74 of first switch 60. This connection may allow external load 24 to pull output terminal 18 lower in voltage. The lower voltage on output terminal 18 results in a lower voltage on input terminal 74 of first switch 60, which further limits current flow through n-channel IGFET 54 to external load 24. This permits external load 24 to pull output terminal 18 even lower in voltage, which reduces the control voltage on first switch 60 even more. In this manner, a positive feedback loop is created. Eventually, first switch 60 is fully "off" and output terminal 18 is at or near ground potential.

Figure 3:
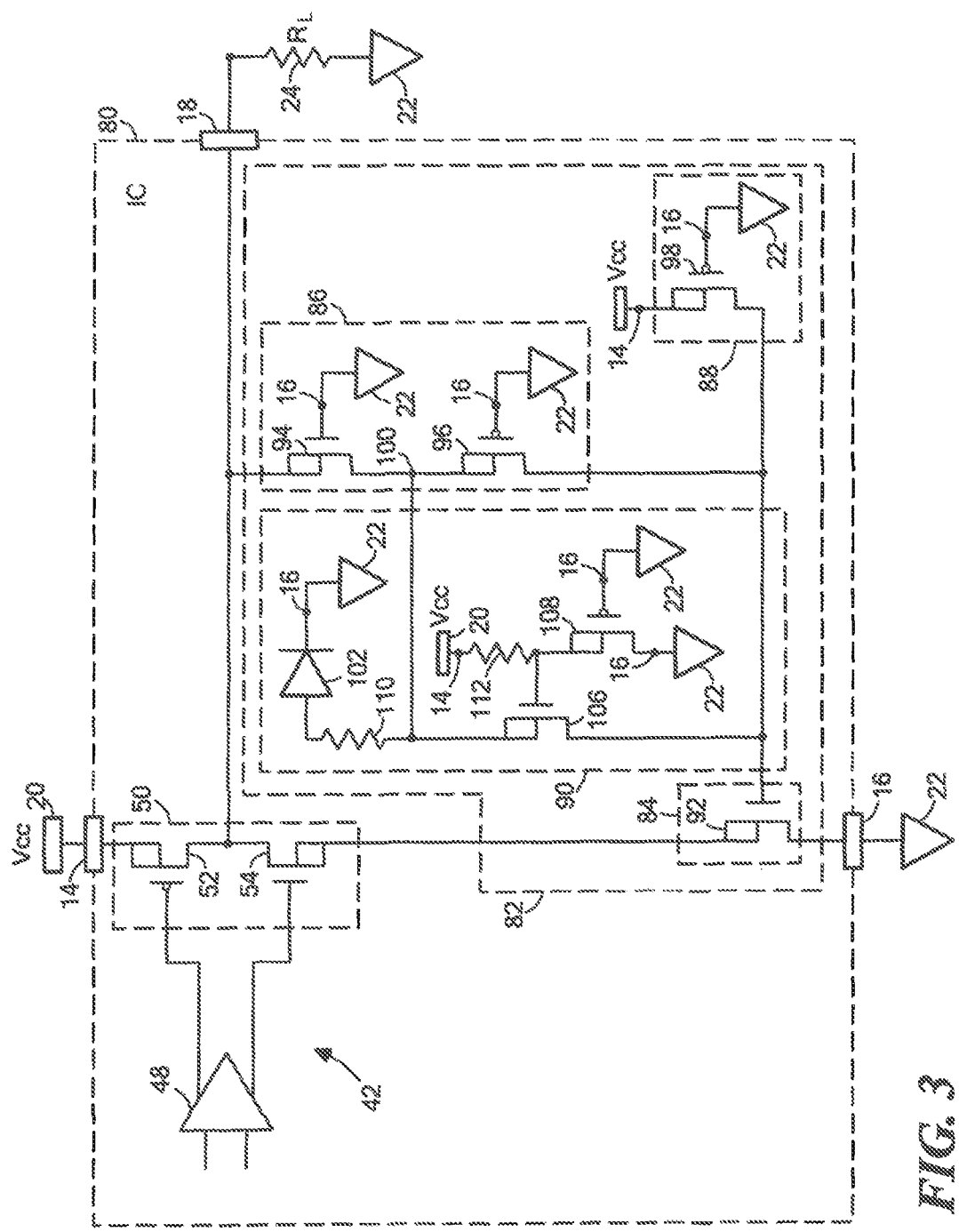
FIG. 3 is a schematic diagram illustrating another example integrated circuit that is capable of detecting a break in a ground or supply connection in accordance with one or more implementations.

FIG. 3 is a schematic diagram illustrating an example integrated circuit 80 that is capable of detecting a break in a ground or supply connection in accordance with one or more implementations. In response to detection of a break, integrated circuit 80 is capable of significantly reducing or eliminating a flow of current to or from an output terminal of the device. Integrated circuit 80 may represent, for example, a specific embodiment of integrated circuit 40 of FIG. 2. As before, integrated circuit 80 has a supply terminal 14 for connection to an external power supply 20, a ground terminal 16 for connection to an external ground 22, and an output terminal 18 for connection to an external pull-down load 24. Integrated circuit 80 may also include an output amplifier 42 to drive output terminal 18 and sensing and control circuitry 82. Output amplifier 42 may include an operational amplifier 48 driving an output stage 50. Output stage 50 may include, for example, a p-channel IGFET 52 and an n-channel IGFET 54 connected in a output stage configuration.

As illustrated in FIG. 3, sensing and control circuitry 82 may include a first switch 84, a second switch 86, a third switch 88, and a body bias circuit 90. First switch 84 may include a second n-channel IGFET 92 coupled between first n-channel IGFET 54 of output stage 50 and ground terminal 16. Second switch 86 may include third and fourth n-channel IGFETs 94, 96 connected between output terminal 18 of integrated circuit 80 and a gate terminal of second n-channel IGFET 92. As illustrated, the gate terminals of third and fourth n-channel IGFETs 94, 96 are each connected to ground terminal 16 of integrated circuit 80 and the bodies of third and fourth n-channel IGFETs 94, 96 are each connected to a node 100 between the devices. Third switch 88 includes a p-channel IGFET 98 coupled between supply terminal 14 and the gate terminal of n-channel IGFET 92. The gate terminal of p-channel IGFET 98 may be coupled to ground terminal 16.

During normal device operation, the gate terminal of p-channel IGFET 98 will be at ground potential, which keeps the transistor in an "on" condition, thereby connecting the gate terminal of n-channel IGFET 92 to supply voltage Vcc. This turns "on" second n-channel IGFET 92, resulting in a low impedance between first n-channel IGFET 54 of output stage 50 and ground 22. When a break occurs in the ground connection of integrated circuit 80, the voltage on ground terminal 16 may increase toward Vcc. This will turn "off" p-channel IGFET 98 and de-couple the gate terminal of second n-channel IGFET 92 from the supply voltage Vcc. At about the same time, third and fourth n-channel IGFETs 94, 96 of second switch 86 will turn "on," thereby coupling output terminal 18 of integrated circuit 80 to the gate terminal of second n-channel IGFET 92.

As shown in FIG. 3, body bias circuit 90 may include: a diode 102, first and second resistors 110, 112, a second p-channel IGFET 108, and a fifth n-channel IGFET 106. During normal device operation, node 100 of second switch 86 (and, therefore, the bodies of third and fourth n-channel IGFETs 94, 96) is coupled to ground 22 through resistor 110 and diode 102. When a break occurs in the ground connection, however, this connection to ground is cut off since ground node 22 is pulled up by the chip impedance and the diode blocks current flowing from ground to node 100. Diode 102 prevents any flow of current in the reverse direction from ground terminal 16. The gate and source terminals of second p-channel IGFET 108 are coupled to ground terminal 16 of integrated circuit 80. When the ground connection is broken, the gate terminal of second p-channel IGFET 108 transitions high, turning "off" second p-channel IGFET 108. The gate terminal of fifth n-channel IGFET 106 is then pulled up to Vcc by resistor 112, turning "on" this transistor. When fifth n-channel IGFET 106 is turned "on," node 100 of second switch 86 (and, therefore, the bodies of third and fourth n-channel IGFETs 94, 96) is connected to the gate terminal of second n-channel IGFET 92. As described previously, this permits load resistor 24 to pull the voltage on output terminal 18 lower which results in a lower voltage on the gate terminal of second n-channel IGFET 92. The lower voltage on the gate terminal of second n-channel IGFET 92 causes less current to flow through n-channel IGFET 54 of output stage 50 which allows load resistor 24 to pull output terminal 18 even lower. This sets up a positive feedback loop that eventually results in a ground potential (or near ground potential) on the output terminal 18. This ground potential may then be sensed by external diagnostic circuitry as an indication of a ground fault.

Figure 4:
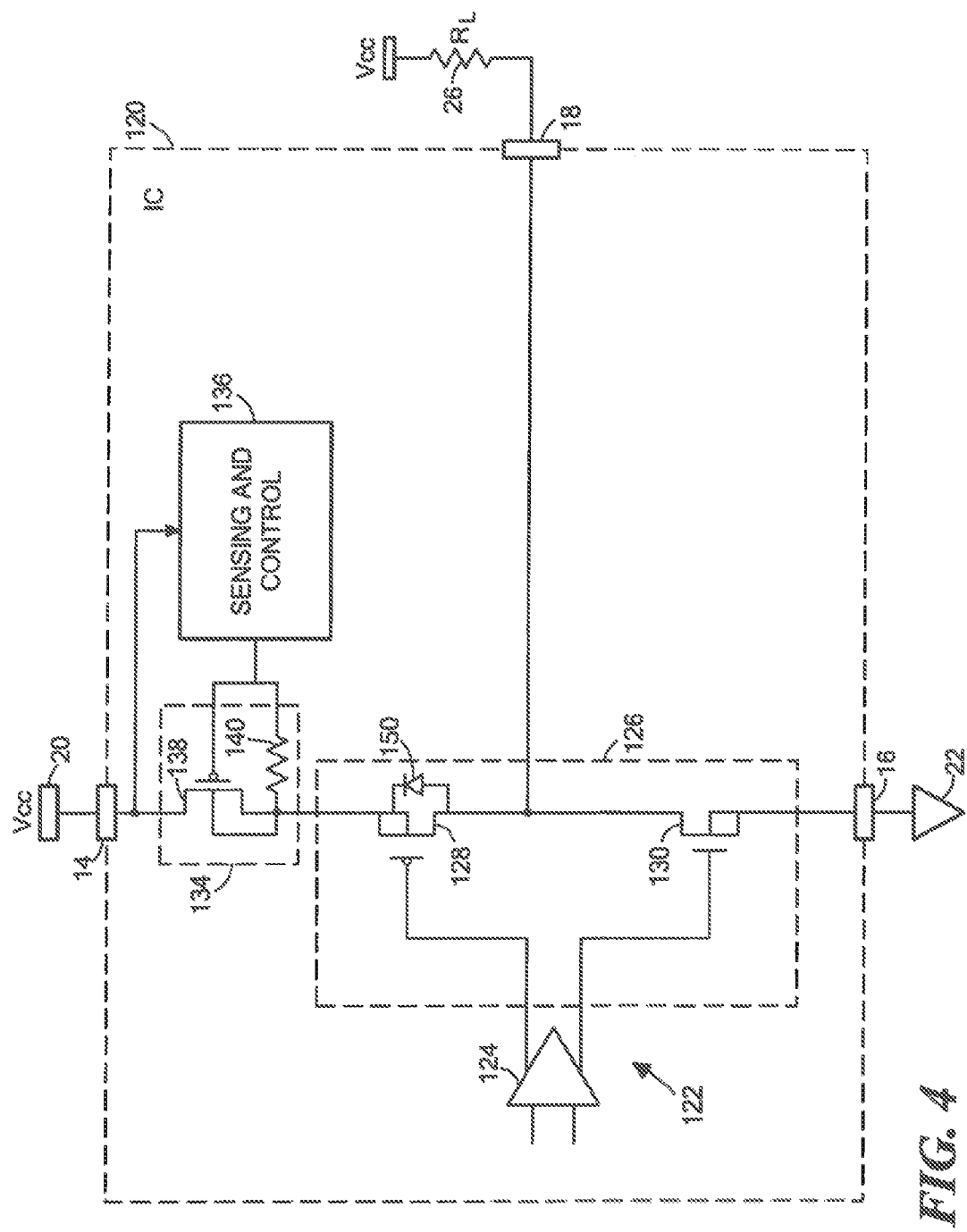
FIG. 4 is a schematic diagram illustrating still another example integrated circuit that is capable of detecting a break in a supply or ground connection in accordance with one or more implementations.

As described above, sometimes an integrated circuit may be called upon to drive a pull-up load rather than a pull down load. In these devices, techniques may also be needed to detect breaks in ground and/or supply connections and to indicate same to an exterior environment. FIG. 4 is a schematic diagram illustrating an example integrated circuit 120 connected to a pull-up load that is capable of detecting and indicating a break in a ground or supply connection. As in the other embodiments, integrated circuit 120 is capable of significantly reducing or eliminating a flow of current through an output terminal in response to detection of a break. However, because a pull-up load is being used, the output terminal is pulled up to the supply potential Vcc when a break occurs. As illustrated, integrated circuit 120 has a supply terminal 14 for connection to an external power supply 20, a ground terminal 16 for connection to an external ground 22, and an output terminal 18 for connection to an external pull-up load 26. Integrated circuit 120 may also include an output amplifier 122 that includes an operational amplifier circuit 124 driving an output stage 126. Output stage 126 may include, for example, a p-channel IGFET 128 and an n-channel IGFET 130 connected in an output stage configuration. Integrated circuit 120 may also include a switch 134 connected between supply terminal 14 and p-channel IGFET 128 of output stage 126 and a sensing and control circuit 136 connected between supply terminal 14 and an input terminal of switch 134. Sensing and control circuit 136 is operative for sensing the occurrence of a break in a supply connection of integrated circuit 120 and to cause a predetermined voltage level to be output at output terminal 18 in response thereto.

With reference to FIG. 4, in some implementations, switch 134 may include a p-channel IGFET 138 having a drain terminal connected to supply terminal 14 and a source terminal connected to p-channel IGFET 128 of output stage 126. A body of p-channel IGFET 138 may be connected to the source of the same device and both through a resistor 140 to a gate terminal of the same transistor. During normal device operation, sensing and control circuit 136 will sense that Vcc is connected and place a low voltage on the gate terminal of p-channel IGFET 138 to turn the device "on." This will connect the supply potential Vcc to p-channel IGFET 128 of output stage 126 allowing output amplifier 122 to operate normally.

A parasitic diode 150 may exist between the source terminal of p-channel IGFET 128 and the body/drain terminal of the device. If a break occurs in a connection between supply terminal 14 and external power supply 20, the voltage on supply terminal 14 will transition toward ground potential due to the internal chip impedance. This could result in a situation where a current starts to flow from the pull up load 26 through parasitic diode 150 and toward supply terminal 14 and as the supply wire is broken the current will re-enter and flow to terminal 16 through the general system. In synthesis, the IC 120 may get incorrectly powered up through the terminal 18 into terminal 16. To prevent this current, sensing and control circuit 136 may sense the drop in voltage on supply terminal 14 and cause and allow the gate of p-channel IGFET 138 to float. As a result, resistor 140 will ensure that p-channel IGFET 138 has zero voltage across source, body, and gate forcing it into an off state. This will prevent current from flowing into terminal 18 and through diode 150. Because this current is reduced or eliminated, pull-up load 26 is able to pull up the voltage on output terminal 18 to a level at or near supply voltage Vcc. External diagnostic circuitry may then be able to recognize this output level as an indication of a break in the supply connection.

Figure 5:
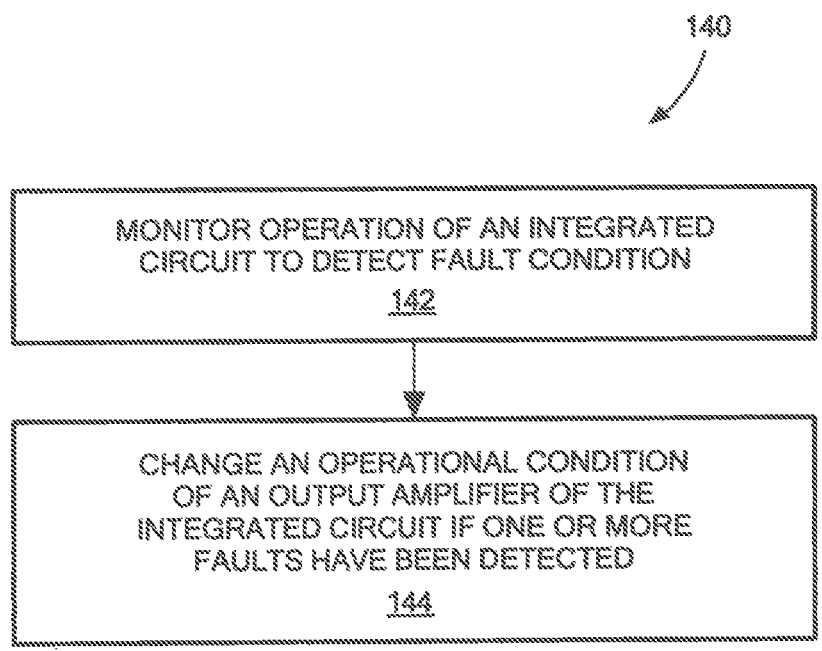
FIG. 5 is a flowchart illustrating an example method for operating an integrated circuit in accordance with one or more implementations.

FIG. 5 is a flowchart illustrating an example method 140 for operating an integrated circuit in accordance with an implementation. Device operation is monitored to detect whether a fault condition has occurred (block 143). In some implementations, the fault condition may include a break in a connection between a ground terminal of the integrated circuit and an external ground. In other implementations, the fault condition may include a break in a connection between a supply terminal of the integrated circuit and an external power supply. In still other implementations, monitoring may be performed for both of these fault conditions. Other fault conditions may also, or alternatively, be monitored. If a fault condition is detected, an operational condition of an output amplifier of the integrated circuit may be changed (block 144). The modification of the operational condition of the output amplifier may be intended to prevent (or reduce) a leakage current from flowing through the output amplifier either to or from an external load coupled to the integrated circuit. By preventing or reducing this flow of current, the external load is then able to accurately pull-up or pull-down the output terminal of the integrated circuit. In this manner, a signal level may be placed on the output terminal of the integrated circuit that may be used by external diagnostic circuitry to identify the existence of a fault condition.

Various techniques for performing the modification of the operational condition of the output amplifier may be used. In one possible approach for an integrated circuit driving a pull-down load, a large impedance may be switched in series with a transistor of the output amplifier to block a flow of current through a parasitic element of the transistor when a ground fault condition occurs. For example, as discussed previously, in one implementation, a transistor switch may be situated between an n-channel transistor of an output stage of an integrated circuit and a ground terminal. The switch may be kept in an "on" condition during normal operation of the integrated circuit and switched to an "off" condition if a break in a ground connection is detected. When in the "off" condition, the switch may reduce or eliminate a flow of current through a parasitic element of the n-channel transistor of the output stage to the external load. By reducing or eliminating this current, the external load is then able to pull-down the output terminal to ground potential, which can be recognized by external diagnostic circuitry as an indication of a ground fault within the integrated circuit.

For an integrated circuit driving a pull-up load, a large impedance may be switched in series with a transistor of the output amplifier to block a flow of current through a parasitic element of the transistor when a supply fault condition occurs. For example, as discussed previously, in one implementation, a transistor switch may be situated between a p-channel transistor of an output stage of an integrated circuit and a power supply terminal. The switch may be kept in an "on" condition during normal operation of the integrated circuit and switched to an "off" condition if a break in a supply connection is detected. When in the "off" condition, the switch may reduce or eliminate a flow of current from the pull-up load through a parasitic element of the p-channel transistor of the output stage. By reducing or eliminating this current, the external load is then able to pull-up the output terminal to the supply potential, which can be recognized by external diagnostic circuitry as an indication of a ground fault within the integrated circuit.

In the description above, specific types of transistors and other components are described in connection with various implementations. As will be understood by persons of ordinary skill in the art, in other implementations, other types of transistors and other types of components may be used in place of the specific types described heretofore. As used herein, the word "terminal" is intended to include any type of lead, pin, contact, node, connector, solder bump, or terminal associated with an integrated circuit that is connected to, or can be connected to, external circuitry.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit comprising:
a supply terminal to connect to an external power supply;
a ground terminal to connect to an external ground;
an output terminal to connect to an external load;
an output amplifier coupled to the output terminal to generate an output signal on the output terminal during normal device operation; and
circuitry to prevent current from flowing through the output terminal if at least one of the following occurs during device operation: a connection between the ground terminal and the external ground is broken and a connection between the supply terminal and the external power supply is broken;
wherein the external load is an external pull-down load, the output amplifier includes an output stage having a p-channel transistor and an n-channel transistor; and the circuitry to prevent current from flowing through the output terminal includes:
a first switch coupled between the n-channel transistor and the ground terminal; and
a control circuit to detect a break in a connection between the ground terminal and the external ground and to turn off the first switch in response thereto, wherein the control circuit comprises a second switch connected between the output terminal of the integrated circuit and an input terminal of the first switch, the second switch to turn on if a break occurs in a connection between the ground terminal and the external ground to provide a low impedance path between the output terminal of the integrated circuit and an input terminal of the first switch.

2. The integrated circuit of claim 1, wherein:
the p-channel transistor includes a p-channel insulated gate field effect transistor (IGFET) and the n-channel transistor includes an n-channel IGFET.

3. The integrated circuit of claim 1, wherein the control circuit further comprises:
a body bias circuit to modify a body bias condition of the second switch if a break occurs in a connection between the ground terminal and the external ground.

4. The integrated circuit of claim 3, wherein:
the second switch includes a first n-channel insulated gate field effect transistor (IGFET) and a second n-channel IGFET connected in tandem between the output terminal of the integrated circuit and the input terminal of the first switch, wherein a body of the first n-channel IGFET and a body of the second n-channel IGFET are both connected to a node between the first n-channel IGFET and the second n-channel IGFET; and
the body bias circuit includes a transistor to electrically couple the node to the input terminal of the first switch if a break occurs in a connection between the ground terminal and the external ground and to de-couple the node from the input terminal of the first switch during normal device operation.

5. The integrated circuit of claim 4, wherein:
the body bias circuit couples the node to the ground terminal during normal device operation.

6. The integrated circuit of claim 4, wherein the control circuit further comprises:
a third switch connected between the supply terminal and an input terminal of the first switch, the third switch to electrically couple the input terminal of the first switch to a supply potential during normal operation and to de-couple the input terminal of the first switch from the supply potential if a break occurs in a connection between the ground terminal and the external ground.

7. The integrated circuit of claim 1, wherein:
the first switch, when turned off, prevents a flow of current to the external load through the n-channel transistor of the output amplifier.

8. A method for operating an integrated circuit having an output amplifier to drive an external load through an output terminal, the method comprising:

monitoring operation of the integrated circuit to detect whether one or more of the following events have occurred: a connection between a ground terminal of the integrated circuit and an external ground is broken and a connection between a supply terminal of the integrated circuit and an external power supply is broken; and changing an operational condition of the output amplifier if one or more of the events have occurred, wherein changing the operational condition of the output amplifier includes switching a switch to prevent current flow through a parasitic element of the output amplifier;

wherein the external load is a pull-down load, the output amplifier includes an output stage having a p-channel transistor and an n-channel transistor, and changing an operational condition includes turning off a first switch located between the n-channel transistor and the ground terminal if a break occurs in a connection between the ground terminal and the external ground, wherein turning off the first switch includes electrically coupling an input terminal of the first switch to the output terminal of the integrated circuit and electrically de-coupling the input terminal of the first switch from the supply terminal of the integrated circuit in response to a break in the connection between the ground terminal and the external ground.

9. The method of claim 8, wherein:

electrically coupling the input terminal of the first switch to the output terminal of the integrated circuit includes turning on a second switch, the second switch including two n-channel transistors connected in series, the two n-channel transistors having a node interconnecting them that is connected to bodies of the two n-channel transistors.

10. The method of claim 9, wherein:

turning off the first switch further includes de-coupling the node between the two n-channel transistors of the second switch from the ground terminal.

11. The method of claim 10, wherein:

turning off the first switch further includes coupling the node between the two n-channel transistors of the second switch to the input terminal of the first switch.

12. An integrated circuit comprising:

a supply terminal to connect to an external power supply;

a ground terminal to connect to an external ground;

an output terminal to connect to an external pull-down load;

an output amplifier coupled to the output terminal to generate an output signal on the output terminal during normal device operation, the output amplifier including an output stage having a p-channel transistor and an n-channel transistor; and circuitry to prevent current from flowing through the output terminal if a connection between the ground terminal and the external ground is broken, the circuitry including: a first switch coupled between the n-channel transistor and the ground terminal, and a control circuit to control a conduction state of the first switch, the control circuit comprising:

a second switch connected between the output terminal of the integrated circuit and an input terminal of the first switch, wherein the second switch is configured to turn on in response to a break in a connection between the ground terminal and the external ground, the second switch including first and second transistors;

a body bias circuit configured to electrically couple the input terminal of the first switch to bodies of the first and second transistors of the second switch in response to a break in the connection between the ground terminal and the external ground; and a third switch connected between the supply terminal and the input terminal of the first switch, wherein the third switch is configured to de-couple the input terminal of the first switch from the supply terminal in response to a break in the connection between the ground terminal and the external ground.

13. The integrated circuit of claim 12, wherein:

the body bias circuit is configured to electrically couple the bodies of the first and second transistors of the second switch to the ground terminal and to electrically de-couple the bodies of the first and second transistors of the second switch from the input terminal of the first switch during normal integrated circuit operation.

14. The integrated circuit of claim 12, wherein:

the first and second transistors of the second switch are connected together in series between the output terminal of the integrated circuit and an input terminal of the first switch, wherein the bodies of the first and second transistors are electrically connected to a node between the first and second transistors within the series connection.

15. The integrated circuit of claim 12, wherein:

the circuitry to prevent current from flowing through the output terminal forms a positive feedback loop that causes the first switch to turn fully off and the output terminal to reach ground potential in response to a break in the connection between the ground terminal and the external ground.

* * * * *

UNITED STATES PATENT AND TRADEMARK OFFICE
CERTIFICATE OF CORRECTION

PATENT NO. : 8,937,797 B2
APPLICATION NO. : 13/423891
DATED : January 20, 2015
INVENTOR(S) : Franco Noel Martin Pirchio et al.

It is certified that error appears in the above-identified patent and that said Letters Patent is hereby corrected as shown below:

In the Specification

Column 2, line 61 delete "re-channel" and replace with --n-channel--.

Signed and Sealed this
Fifteenth Day of March, 2016

Michelle K. Lee
*Director of the United States Patent and Trademark Office*